(12) United States Patent
Im

(10) Patent No.: US 6,671,204 B2
(45) Date of Patent: Dec. 30, 2003

(54) NONVOLATILE MEMORY DEVICE WITH PAGE BUFFER HAVING DUAL REGISTERS AND METHODS OF USING THE SAME

(75) Inventor: Heung-Soo Im, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 120 days.

(21) Appl. No.: 10/013,191

(22) Filed: Dec. 7, 2001

(65) Prior Publication Data

US 2003/0016562 A1 Jan. 23, 2003

Related U.S. Application Data

(60) Provisional application No. 60/307,572, filed on Jul. 27, 2001.

(51) Int. Cl.[7] ............................................. G11C 16/16
(52) U.S. Cl. ............................ 365/185.12; 365/185.11; 365/185.22; 365/185.17
(58) Field of Search ...................... 365/185.11, 185.12, 365/185.17, 185.22, 185.25

(56) References Cited

U.S. PATENT DOCUMENTS

| | | | |
|---|---|---|---|
| 5,671,178 A | 9/1997 | Park et al. | 365/185.22 |
| 5,831,900 A | 11/1998 | Miyamoto | 365/185.03 |
| 5,862,099 A | 1/1999 | Gannage et al. | 365/238.5 |
| 5,896,317 A | 4/1999 | Ishii et al. | 365/185.23 |
| 5,936,890 A | 8/1999 | Yeom | 365/185.22 |
| 5,982,663 A | 11/1999 | Park | 365/185.09 |
| 5,996,041 A | 11/1999 | Kim | 711/103 |
| 6,078,546 A | 6/2000 | Lee | 365/233 |
| 6,452,853 B2 * | 9/2002 | Iwahashi | 365/226 |
| 6,483,752 B2 * | 11/2002 | Hirano | 365/185.33 |
| 6,512,694 B2 * | 1/2003 | Herdt | 365/185.17 |

FOREIGN PATENT DOCUMENTS

| | | | | |
|---|---|---|---|---|
| EP | 0840326 A2 | 5/1998 | | G11C/11/56 |

* cited by examiner

Primary Examiner—Andrew Q. Tran
(74) Attorney, Agent, or Firm—Marger Johnson & McCollom, P.C.

(57) ABSTRACT

A memory device has an array of memory cells to store data, and a Y-gating circuit to gate data stored in a group of the memory cells. A page buffer is coupled between the memory cell array and the Y-gating circuit. The page buffer includes a dual register corresponding to each memory cell of the group. The dual register includes a first register and an associated second register. The first and second registers are adapted to exchange data with each other, with cells of the memory cell array, and with the Y-gating circuit.

22 Claims, 20 Drawing Sheets

Fig. 19

| | 4M (521K*8) | 8M (1M*8) | 16M (2M*8) | 32M (4M*8) | 64M (8M*8) | 128M (16M*8) | 256M (32M*8) | 512M (64M*8) | 1G (128M*8) | 2G (256M*8) |
|---|---|---|---|---|---|---|---|---|---|---|
| PAGE | 32Byte | 264B (256+8) | 264B (256+8) | 528B (512+16) | 528B (512+16) | 528B (512+16) | 528B (512+16) | 528B (512+16) | 2112B (2048+64) | 2112B (2048+64) |
| BLOCK | 4Kbyte | 16P | 16P | 16P | 16P | 32P | 32P | 32P | 64P | 64P |
| DEVICE | 128Block | 256B | 512B | 512B | 1024B | 1024B | 2048B | 4096B | 1024B | 2048B |

DEVICE A    DEVICE B

NONVOLATILE MEMORY DEVICE WITH PAGE BUFFER HAVING DUAL REGISTERS AND METHODS OF USING THE SAME

CROSS REFERENCE TO RELATED APPLICATIONS

This application claims priority from U.S. Provisional Application No. 60/307,572, filed on Jul. 23, 2001, which is hereby incorporated by reference.

BACKGROUND OF THE INVENTION

1. Field of the Invention

The present invention is related to the field of semiconductor memory devices and, more specifically, to a flash memory device with a page buffer circuit having dual registers.

2. Description of the Related Art

The recent trends in semiconductor memory devices are for high integration, large capacity, and to support systems operating at high speeds. These trends are for both volatile memories (e.g., DRAM and SRAM) and non-volatile memories (e.g., flash memories).

Flash memories are generally subdivided into NOR-type flash memories and NAND-type flash memories. The NOR-type flash memories are used in applications necessary for reading information of a low volume at a high speed non-sequentially, while the NAND-type flash memories are used in applications necessary for reading information sequentially.

Flash memory devices use memory cells to store data. The memory cells include cell transistors. Each cell transistor has a control electrode and a floating gate. Since the flash memory device stores information using tunneling via an insulation film, it takes some time to store information.

In order to store information of a large volume in a short time, the NAND-type flash memory uses a register, which is also known as a page buffer circuit. Large volumes of data are supplied externally, for quick storing in the storage region. They are first stored in the register, and from there in the memory cells.

In the case of a conventional NAND-type flash memory, the magnitude of a page of data does not exceed 512 bytes. If it is assumed that a program time (or information storing time) of a NAND-type flash memory is about 200 to 500 microseconds, and 1-byte of data is loaded on the page buffer circuit from the exterior in a period of 100 nanoseconds, it takes about 50 microseconds to load 512-byte information in the page buffer circuit.

FIG. 1 shows a specific example in the prior art. FIG. 1 of the instant document is from U.S. Pat. No. 5,831,900 (that document's FIG. 7). Additional reference numerals have been added for the present discussion.

The device of FIG. 1 teaches that data are loaded to a latch 30 from a data line IO, after page buffers 20-i are reset by the surrounding circuitry. The data loaded to the latch are programmed to the memory cells 2-1, 2-2, 2-3, through a transistor Q4 (often by receiving an appropriate program command signal). This programming procedure is normally used to program NAND flash memories.

This procedure, however, has a limitation. In this program operation, if data is to be loaded to latch 30, it will have to wait until the data that was previously loaded finish programming in the previous program cycle. As it was described above, data loading to latch 30 progresses by byte units (e.g. 8 bit). So, it takes a long time for data to load to a page of as many as 2048 bytes. This is because latch 30 continues to store data until the information of the register is stored in the appropriate corresponding memory cells.

Another problem in the prior art is the copy back problem. Sometimes, a copy operation needs to be performed from a first page to a second page of data. If it is desired to perform the copy operation after the data of the memory cells in first page is latched to the latch circuit 30 through transistor Q7, then the latched data is programmed to the second page through the transistor Q4. In that case, programmed data copied to the second page are reversed, because of the latch circuit. In other words, 1 has become 0, and 0 has become 1. This problem is addressed in the prior art by providing flag cells to the memory cell array, and updating their value depending on whether the data has been inverted or not.

FIG. 2 shows a specific example of this problem in the prior art. FIG. 2 of the present document is from U.S. Pat. No. 5,996,041 (that document's FIG. 8 and FIG. 9). Additional reference numerals have been added for the present discussion.

In FIG. 2, copy back functions are shown. Data in the first page within the memory cell array is loaded to a page buffer. After that, the data is copied to another place in the array, but in inverted form. The bit to the right is the flag cell, to indicate that this data is in inverted form.

The prior art is limited as to how large the memory devices can become. For example, if it is assumed that the page buffer circuit can temporarily store 2048-byte information, it takes about 200 microseconds to load the 2048-byte of information when 1-byte information is loaded on a page buffer circuit by a period of 100 nanoseconds. Therefore the loading time is nearly similar to the information-storing time (or the program time) of 200 to 500 microseconds. Accordingly, the information-storing characteristic of the NAND-type flash memory is seriously affected by the loading time.

As integration of NAND-type flash memory increases, data must be processed in larger and larger volumes, as compared to the conventional flash memory. And it must be processed without deterioration in the information-storing characteristic.

BRIEF SUMMARY OF THE INVENTION

The present invention overcomes these problems and limitations of the prior art.

Generally, the present invention provides a memory device that has an array of memory cells to store data, and a Y-gating circuit to gate data stored in a group of the memory cells. A page buffer is coupled between the memory cell array and the Y-gating circuit.

The page buffer includes a dual register corresponding to each memory cell of the group. The dual register includes a first register and an associated second register. The first and second registers are adapted to exchange data with each other, with cells of the memory cell array, and with the Y-gating circuit.

The invention permits substantially faster storing of data, and more advantageous copyback than the prior art. Accordingly a memory according to the invention has improved performance.

The invention will become more readily apparent from the following Detailed Description, which proceeds with reference to the drawings, in which:

BRIEF DESCRIPTION OF THE DRAWINGS

FIG. 19 is a table illustrating various design choices for memory devices, including the two of FIG. 18.

DETAILED DESCRIPTION OF THE PREFERRED EMBODIMENT(S)

As has been mentioned, the present invention provides semiconductor memory devices, and methods of using the same. The invention is now described in more detail.

Figure 3:
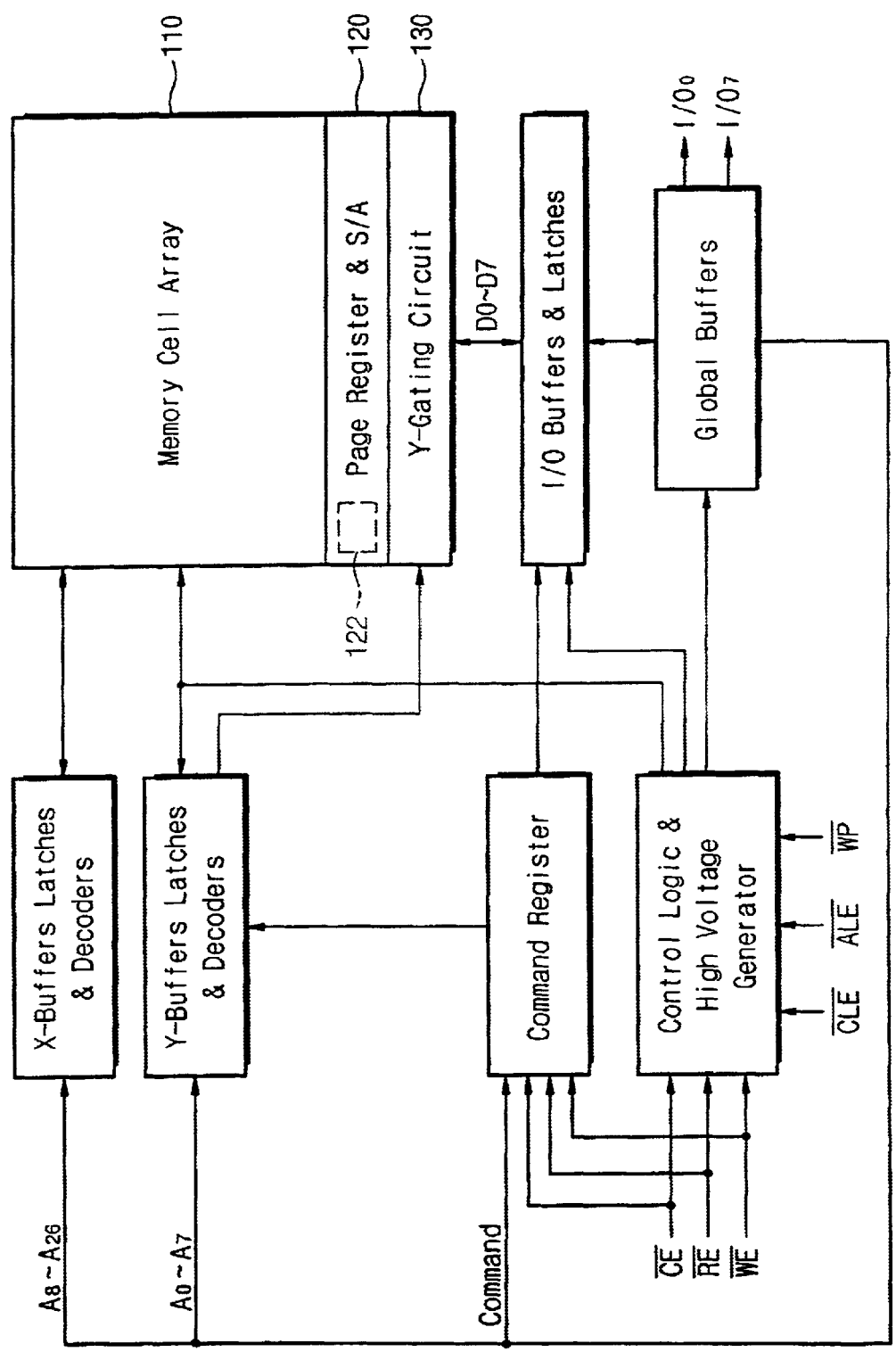
FIG. 3 is a block diagram of a semiconductor memory device made according to an embodiment of the invention.

Referring now to FIG. 3, a memory device 100 made according to the invention is described. Memory device 100 may be a NAND flash memory. Memory device 100 has an array 110 of memory cells to store data, a Page Register and Sense Amplifier (S/A) block 120, and a Y-gating circuit 130 to gate data stored in a group of the memory cells. Page Register and S/A block 120 is coupled between memory cell array 110 and Y-gating circuit 130.

Page Register and S/A block 120 includes a page buffer 122. Page buffer includes a dual registers according to the invention, as will be described in more detail below.

Device 100 also includes additional components, such as X-buffers latches and decoders, Y-buffers latches and decoders, a command register, a Control Logic and High Voltage Generator, and global buffers. They exchange data, address, and command signals as shown, and as will be understood from the below.

Figure 4:
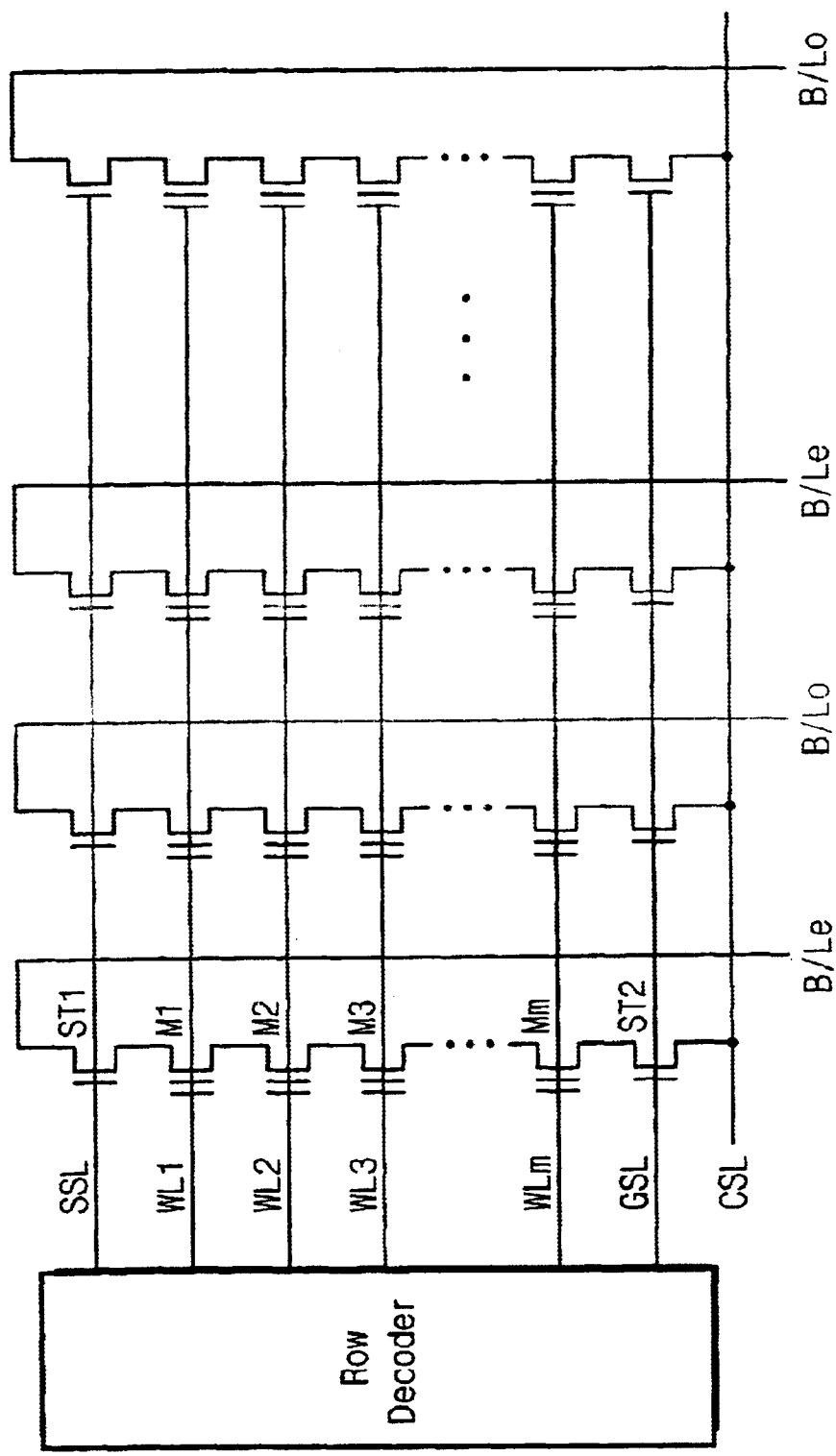
FIG. 4 is a diagram of an array scheme of the memory of FIG. 3.

Referring now to FIG. 4, a sample arrangement is shown for the array 110 of the memory cells. Many bit lines are shown, alternatingly designated BLe, BLo. "e" could be for "even" and "o" could be for "odd". Many memory cells (M1, M2, ..., Mm) are connected to each bit line.

A group of memory cells (e.g. M1) are controlled by a single word line (e.g. WL1). The cells in that group are called a page unit for purposes of this document.

Figure 5:
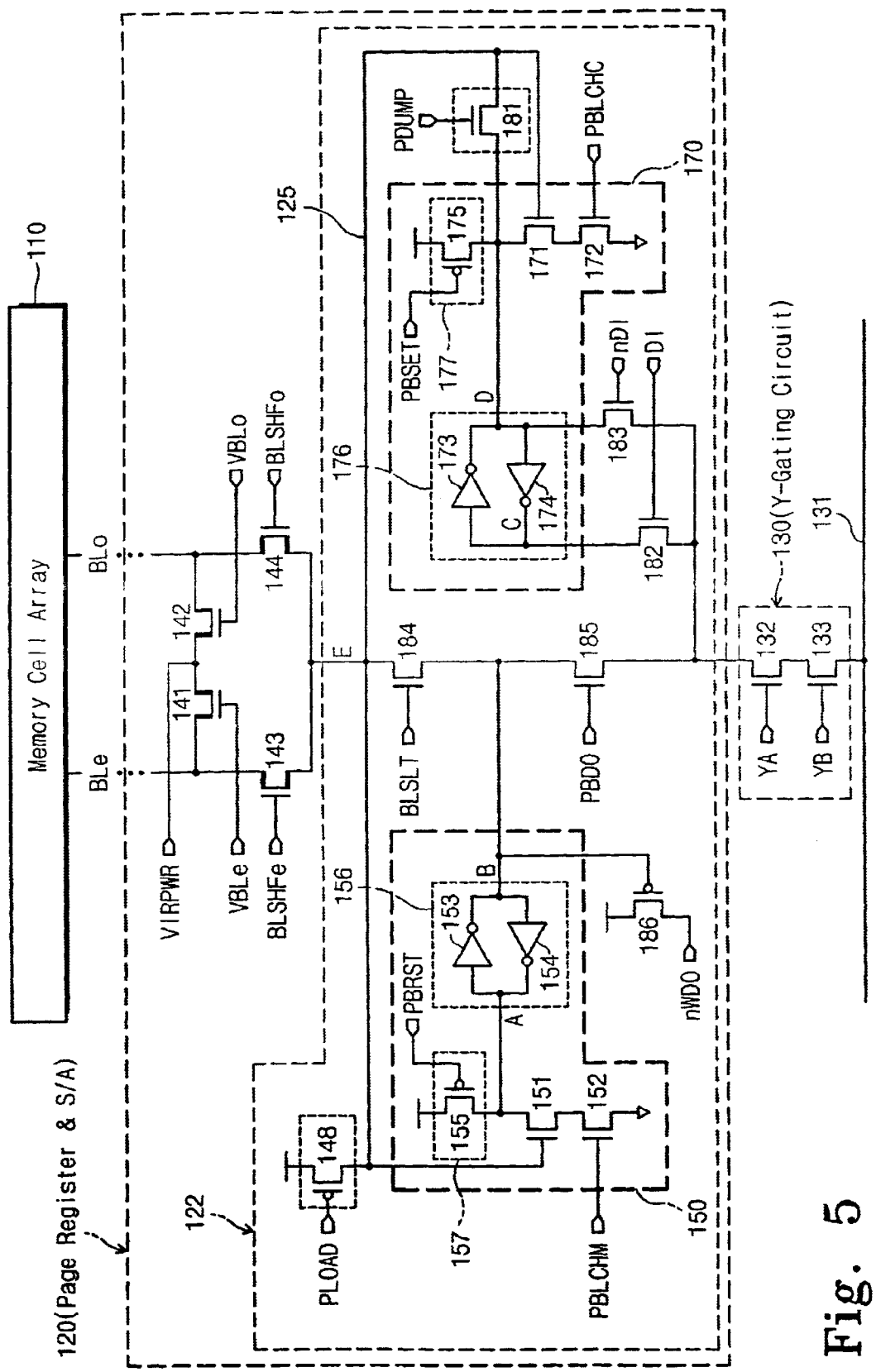
FIG. 5 is a detailed circuit diagram of a page register and a Y-gating circuit of the device of FIG. 3.

Referring now to FIG. 5, Page Register and S/A block 120 and Y-gating circuit 130 are described in more detail.

Y-gating circuit 130 is between Page Register and S/A block 120 and a data line 131. Data line 131 may be for bits D0–D7.

Y-gating circuit 130 is made from two NMOS transistors 132 and 133. Transistors 132 and 133 are controlled by signals YA, YB. Signals YA, YB may be derived from information from a column address.

Page Register and S/A block 120 includes a single page buffer 122, which has a sense line 125 that includes a sense node E. One or more bit lines may be connected to page buffer 122 at node E. In the example of FIG. 5, two bit lines BLe, BLo are connected to node E.

A transistor 141 has a source connected to a corresponding bit line BLe, a drain which is connected to a node providing signal VIRPWR and a gate connected to receive the gate control signal VBLe.

A transistor 142 has a source connected to bit line BLo, a drain which is connected to the node providing signal VIRPWR, and a gate connected to receive the gate control signal VBLo.

The node providing signal VIRPWR is charged at either one of a first or a second supply voltage. Accordingly, transistors 141 and 142 apply the first or second supply voltage to bit lines BLe and BLo, in response to gate control signals VBLe and VBLo.

In addition, a NMOS transistor 143 connects the bit line BLe to node E in response to a BLSHFe signal. Plus, a NMOS transistor 144 connects the bit line BLo to node E in response to a BLSHFo signal.

Page buffer 122 is thus coupled to bit lines BLe, BLo through node E of sense line 125. A PMOS transistor 148 supplies current to the bit lines BLe, BLo via sense line 125 during a read operation. The PMOS transistor 148 is connected between a power supply voltage and the sense line and turns on/off according to a control signal PLOAD.

Importantly, page buffer 122 has two registers 150, 170. The prior art provides only one such register. Both are connected to sense line 125.

Second register 150 is also known as main register 150. Main register 150 includes two NMOS transistors 151, 152, two inverters 153, 154, and a PMOS transistor 155. The data is stored in main latch 156, formed by inverters 153, 154. PMOS transistor 155 forms a precharge circuit for main latch 156.

First register 170 is also called an auxiliary register 170. Auxiliary register 170 includes two NMOS transistors 171, 172, two inverters 173, 174, and a PMOS transistor 175. The data is stored in auxiliary latch 176, formed by inverters 173, 174. PMOS transistor 175 forms a precharge circuit for auxiliary latch 176.

The dual register (made from the two registers 150, 170) of the page buffer 122 of the present invention provide many advantages. Functions are performed better than in the prior art, which are found to justify increasing the magnitude of the page buffer circuit.

Additional structure is provided to facilitate and control exchanging data between the two page buffer registers 150, 170, memory cell array 110, and Y-gating circuit 130.

A NMOS transistor 181 controlled by a control signal PDUMP is turned on to transfer data between auxiliary register 170 and main register 150. Alternately, it is turned off to electrically isolate auxiliary register 170 from main register 150. This transfer is advantageously performed over sense line 125. NMOS transistor 181 is also known as isolation switch.

NMOS transistors 182, 183 provide for storing information in auxiliary register 170. This is performed responsive to the externally input signals DI and nDI, respectively.

A NMOS transistor 184 connects or disconnects main register 150 to or from a selected one of bit lines BLe, BLo. This is performed when information to be programmed is transferred to the selected one of the bit lines from main register 150.

A NMOS transistor 185 is controlled by a control signal PBDO. Transistor 185 outputs information read out via the selected bit line to the exterior of page buffer 122 during a selected interval of time.

A transistor 186 is prepared for checking the program state, and provides program pass/fail information at a node B of main register 150.

Methods of the invention are now described.

Figure 6:
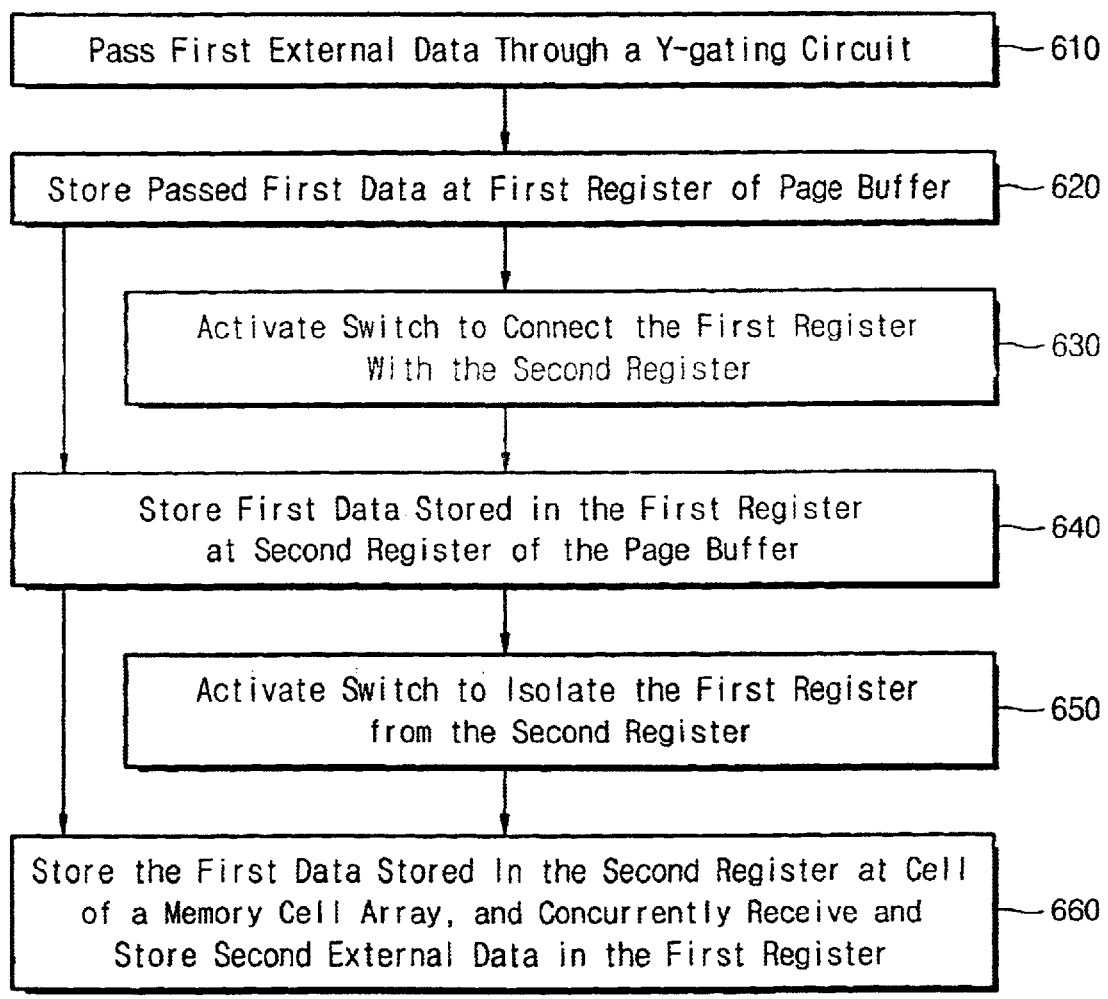
FIG. 6 is a flowchart illustrating a programming method according to an embodiment of the present invention.
Figure 7:
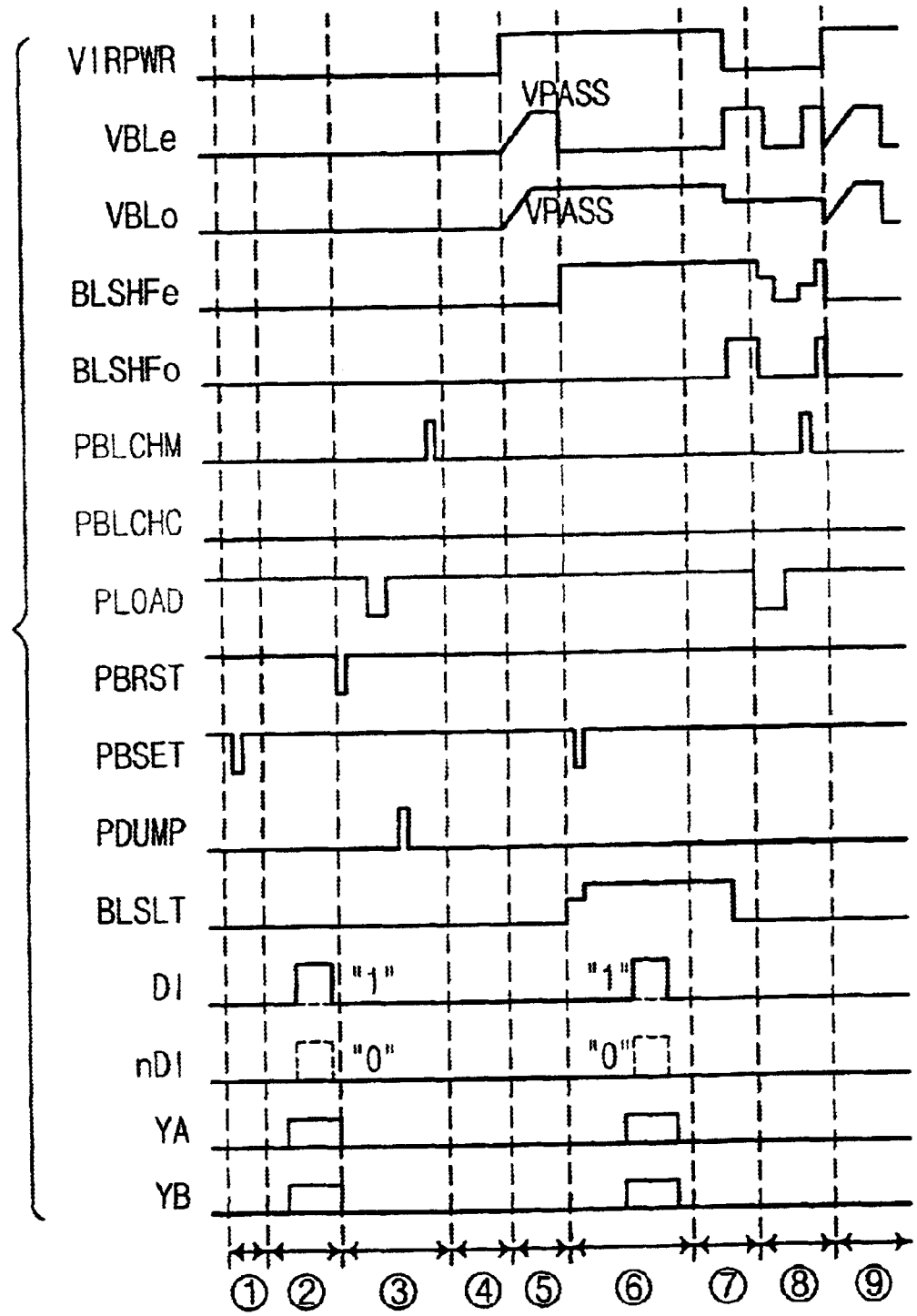
FIG. 7 is a timing diagram of signal commands for effectuating the method of FIG. 6.
Figure 8:
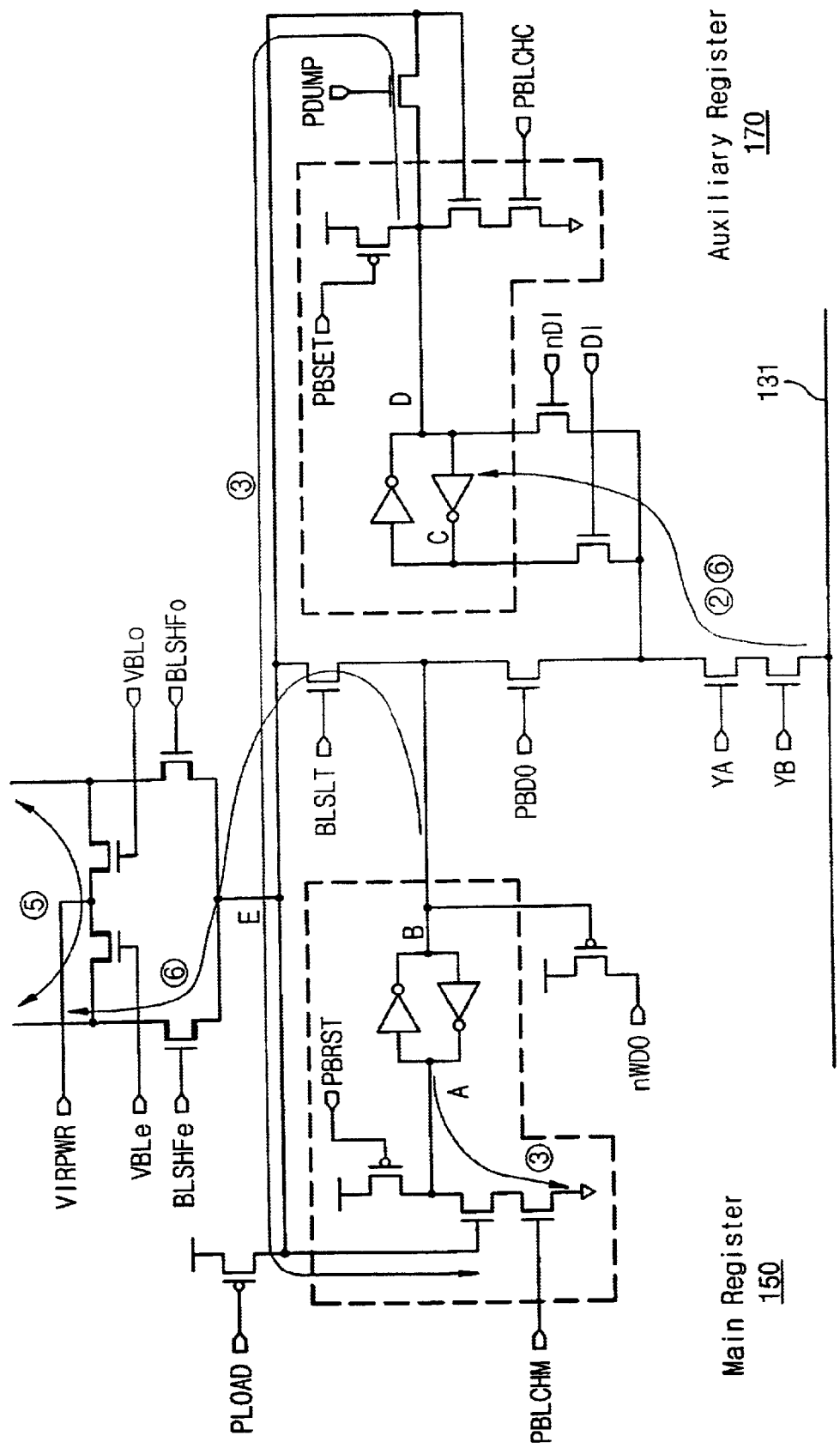
FIG. 8 is a depiction of flow of data in the circuit of FIG. 5, while the signal commands of FIG. 7 are being applied.

Referring now to FIG. 6, FIG. 7, FIG. 8 and also FIG. 4, programming methods according to the invention is described. Programming is where data is input in the memory cells of a device from outside the device.

In FIG. 6, a flowchart 600 is used to illustrate a programming method according to an embodiment of the invention. The method of flowchart 600 may also be practiced by circuit 100 of FIG. 3.

According to a box 610, first external data is passed through a Y-gating circuit, such as circuit 130. The first external data is passed towards a page buffer, such as page buffer 122. It can be a single data or many data. It may even be a whole page of data.

According to a next box 620, the first data passed at box 610 is stored at a first register of a page buffer. The first register may be auxiliary register 170.

According to an optional next box 630, a switch may be activated to connect the first register with a second register. The second register may be main register 150. The switch may be NMOS transistor 181, controlled by control signal PDUMP.

According to a next box 640, the first data that is stored in the first register is stored at the second register.

According to an optional next box 650, the switch may be activated to isolate the first register from the second register.

According to a next box 660, the first data that is stored in the second register is stored at a cell of a memory cell array, which is also called programming. Concurrently, second external data is received at the first register, and stored therein. Therefore, an information-storing operation can be carried out without increasing the information-loading time.

In the embodiment of FIG. 3, the concurrent operation of box 660 is made possible because of the isolation of the first register and the second register. Other methods are also possible.

Referring to FIG. 7 and FIG. 8, a programming method of the invention is described in more detail. FIG. 7 shows command signals that may be applied to the circuit of FIG. 5. The horizontal axis is divided in 9 time segments, respectively labeled 1, 2, ..., 9.

FIG. 8 shows how data is transferred in the circuit of FIG. 5, resulting from applying the command signals of FIG. 7. FIG. 8 should be referred to along with FIG. 7, using the same cross referenced time segments as FIG. 7.

At a first step (time segment 1), a data line 131 is taken to a ground voltage, and transistor 175 is turned on by PBSET signal. This is also known as page buffer setting for the first page.

Afterwards (time segment 2) a node D of auxiliary latch 176 is at a high state, and NMOS transistors 132 and 133 are turned on. Data "0" or "1" in data line is thus stored to auxiliary latch 176 by applying phases of DI and nDI signals. This is also known as data loading of the first page, and loosely corresponds to box 610 described above.

Then (time segment 3), the stored data is transferred to sense line 125 from the auxiliary register 170. This is accomplished by transitioning control signal PDUMP to a logic high state. Prior to transferring the data to main register 150, sense line 125 and node A of latch 156 are precharged by the transistor 148 and 155 respectively.

Afterwards (time segment 4) the signals are zeroed. The process is also called HV enable.

Then (time segment 5), the appropriate one of the bit lines BLe, BLo is set up, by being precharged.

Then (time segments 6 and 7), two actions happen concurrently, corresponding to box 660 above. The data to be programmed is transferred from main register 150 to selected bit line BLe by activating the BLSLT signal, and from there to the memory cell. In addition, the next data to be programmed is stored (loaded) in auxiliary register 170 from the exterior of the memory device.

Generally, data loading operation is done by byte unit, while programming operation is done by page unit. Data loading means that data is transferred from the data line to the auxiliary register 170, while programming operation means that data transfers from main register 150 to the memory cells in the memory cell array 110. As described above, page unit means that a plurality of memory cells are connected and controlled by a single word line.

Since the two actions take place concurrently, the data-storing characteristic is maintained, even at high volumes of data. Thus Implementing the page buffer circuit with auxiliary register 170 is well worth increasing the magnitude of the page buffer circuit.

Then (time segment 8), the read operation is verified, and (time segment 9), the bit lines are precharged again for the next load/program operation.

Figure 9:
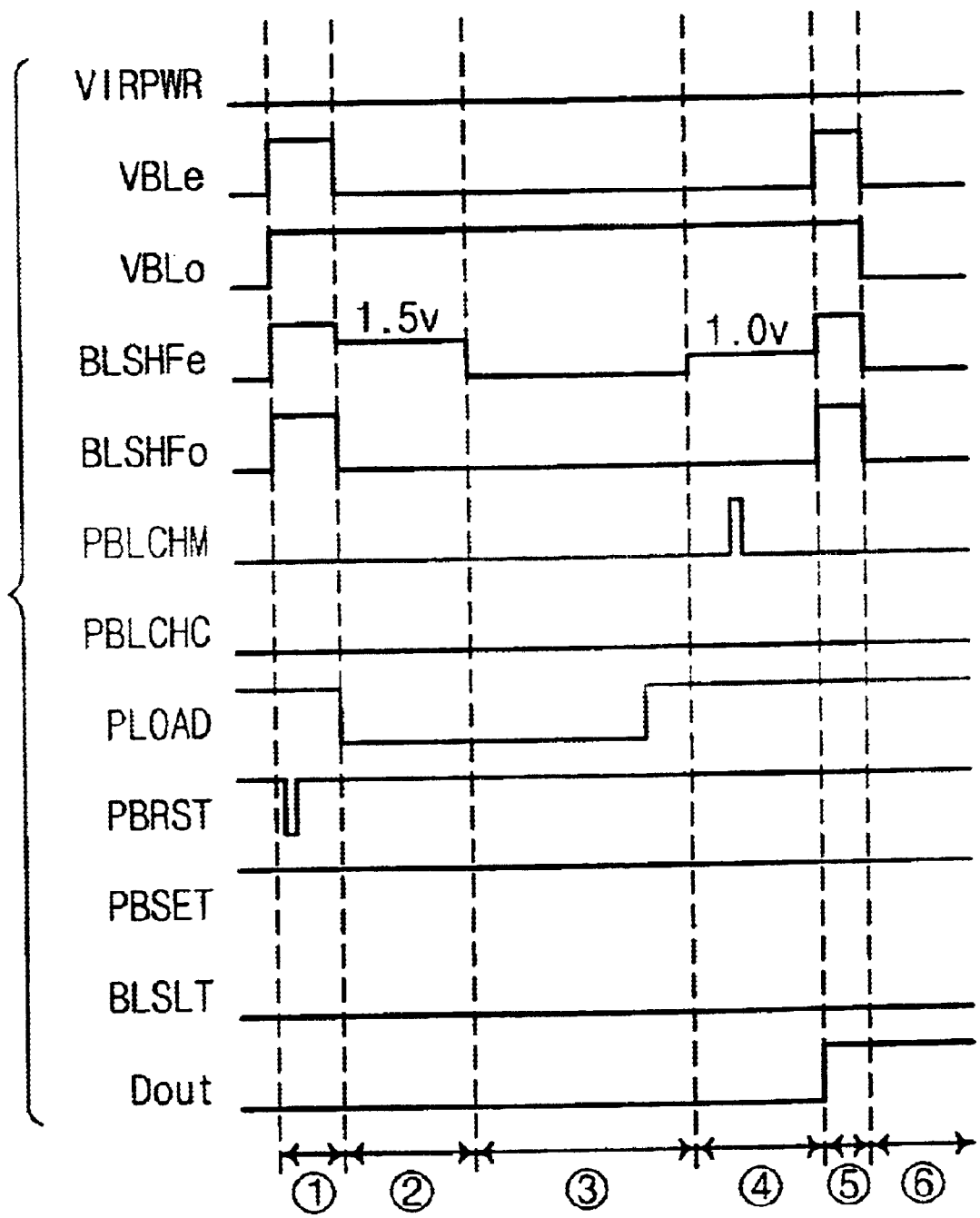
FIG. 9 is a timing diagram of signal commands for effectuating a reading method in the device of FIG. 3.
Figure 10:
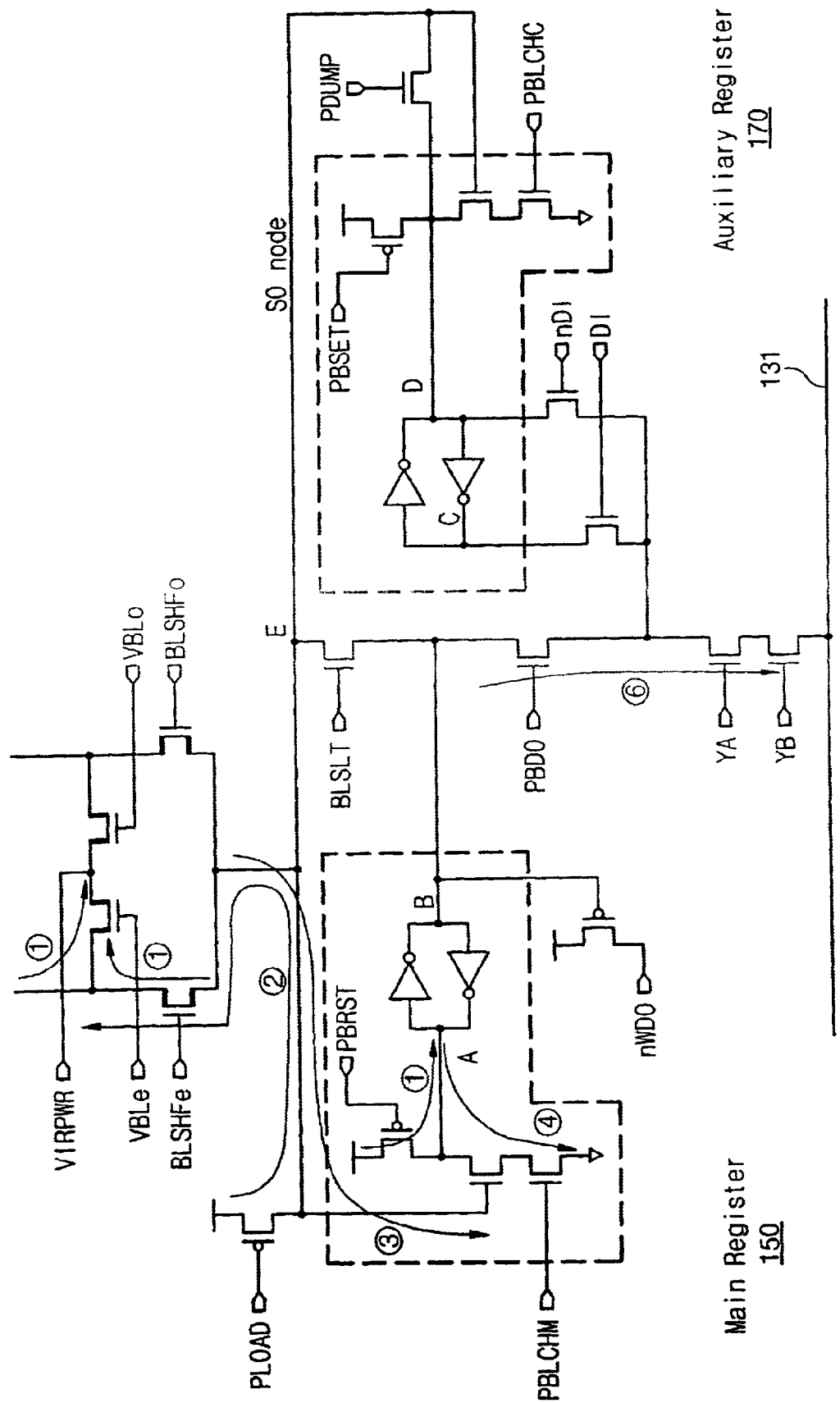
FIG. 10 is a depiction of flow of data in the circuit of FIG. 5, while the signal commands of FIG. 9 are being applied.

Referring now to FIG. 9 and FIG. 10, a read operation of the device of FIG. 3 is described in more detail. Data is assumed to be read out from one of the memory cells of array 110, and that gate control signals of memory cells to be read apply appropriate voltages to word lines.

FIG. 9 shows command signals that may be applied to the circuit of FIG. 5. The horizontal axis is divided in 6 time segments, respectively labeled 1, 2, ..., 6.

FIG. 10 shows how data is transferred in the circuit of FIG. 5, resulting from the command signals of FIG. 9. FIG. 10 should be referred to along with FIG. 9, using the same cross referenced time segments as FIG. 9.

Briefly, reading out is performed directly through main register 150, bypassing auxiliary register 170. This way, auxiliary register 170 does not obstruct reading data, while it facilitates data loading and data programming as per the above.

In order to perform a stable read operation, the bit lines BLe and BLo are first discharged through NMOS transistors 141 and 142 by zeroing the VIRPWR signal, and activating the control signals VBLe and VBLo high. (Time segment 1.)

At the same time, a PBRST signal transitions from a logic high state to a logic low state, so that a state of the main register 150 (or an input of inverter 153) is set to a predetermined state (i.e., a logic high state).

Afterwards, the PLOAD signal goes low, and thus PMOS load transistor 148 is turned on. The control signal BLSHFe of the NMOS transistor 143 is made to have a voltage of summing a bit line precharge voltage and a threshold voltage of the NMOS transistor 143. After precharging the bit line BLe with an appropriate voltage, the BLSHFe signal goes to a logic low state of the ground voltage. (Time segment 2.)

A precharged voltage of the bit line is varied according to a state of a selected memory cell. For example, in the case where the selected memory cell is an off cell, the precharged voltage of the bit line continues to be maintained. In the case where the selected memory cell is an on cell, the precharged voltage of the bit line is lowered. (Time segment 3.)

If a voltage of the BLSHFe signal is changed into an intermediate voltage between the precharge voltage and the previous BLSHFe signal level, a voltage on sense line 125 is maintained at the power supply voltage by shutting-off the NMOS transistor 143 when the selected memory cell is an off cell. If not, however, a voltage on sense line 125 is lowered along a bit line BLe voltage (or is synchronized with a bit line BLe). At a midway point where the BLSHFe signal goes to a logic low state of the ground voltage, the PLOAD signal turns to the power supply voltage.

After this, a gate control signal PBLCHM of NMOS transistor 152 goes to a logic high state of the power supply voltage, and NMOS transistor 151 is turned on or off according to a state of the sense line. As a result, the state of sense line 125 is stored in main register 150. (Time segment 4.)

Then the data stored in main register 150 is transferred to the data line via NMOS transistor 185, which is controlled by control signals PBDO, and next via Y-gating circuit 130. (Time segment 6.)

Copy back methods according to the invention are now described. During the performance of reading operation, it may become necessary to perform a page copy operation by copying data read from a first page of memory cells at a first address to a second page of memory cells at a second address.

Figure 11:
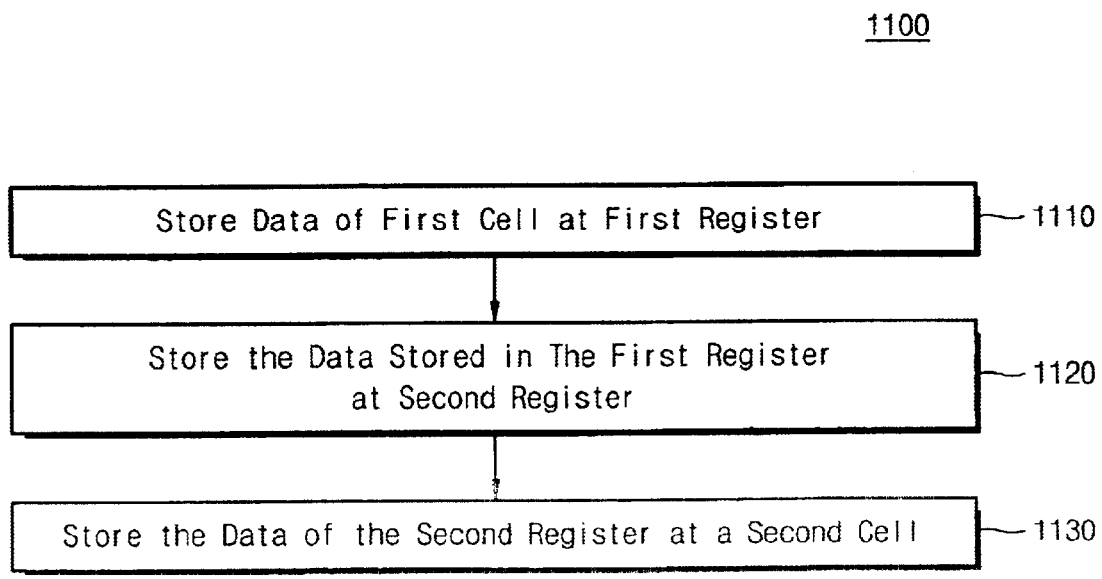
FIG. 11 is a flowchart illustrating a copyback method according to an embodiment of the present invention.

Referring now to FIG. 11, a flowchart 1100 is used to illustrate a copyback method according to an embodiment of the invention. The method of flowchart 1100 may also be practiced by device 100 of FIG. 3.

According to a box 1110, data of a first cell is stored at a first register of a page buffer. This may be performed by reading out data, into the auxiliary register 170. Reading out may be performed as per the above.

According to a next box 1120, the data stored in the first register is stored at the second register of a page buffer. This may be performed by transferring the read out data between the auxiliary register 170 and the main register 150. The transfer may optionally involve activating a switch to connect the first register with the second register.

According to a next box 1130, the data of the second register is stored at a second cell of the memory cell array. This may be performed as a programming operation, as per the above.

Figure 12:
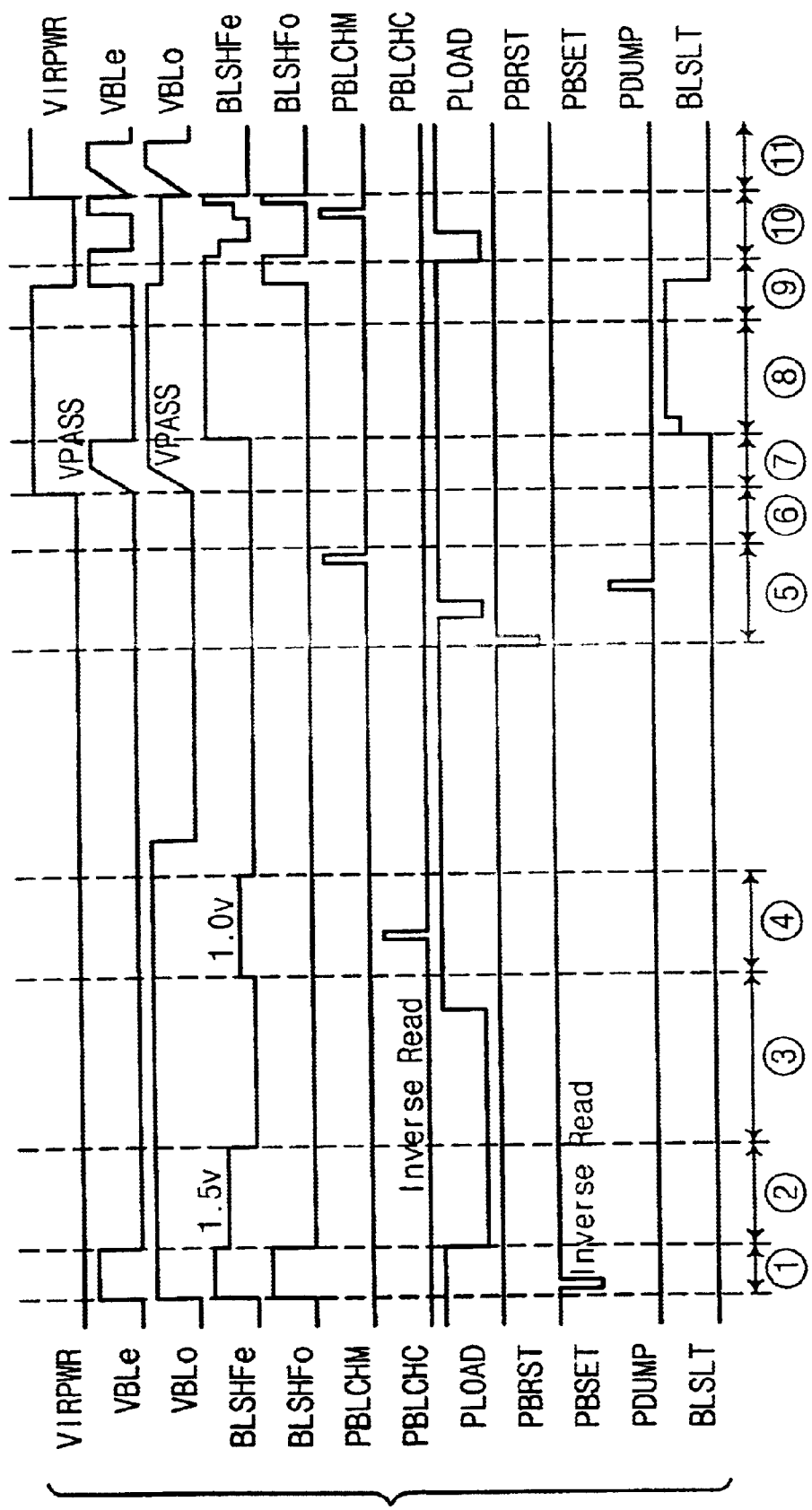
FIG. 12 is a timing diagram of signal commands for effectuating a copyback method according to an embodiment of the present invention in the device of FIG. 3.
Figure 13:
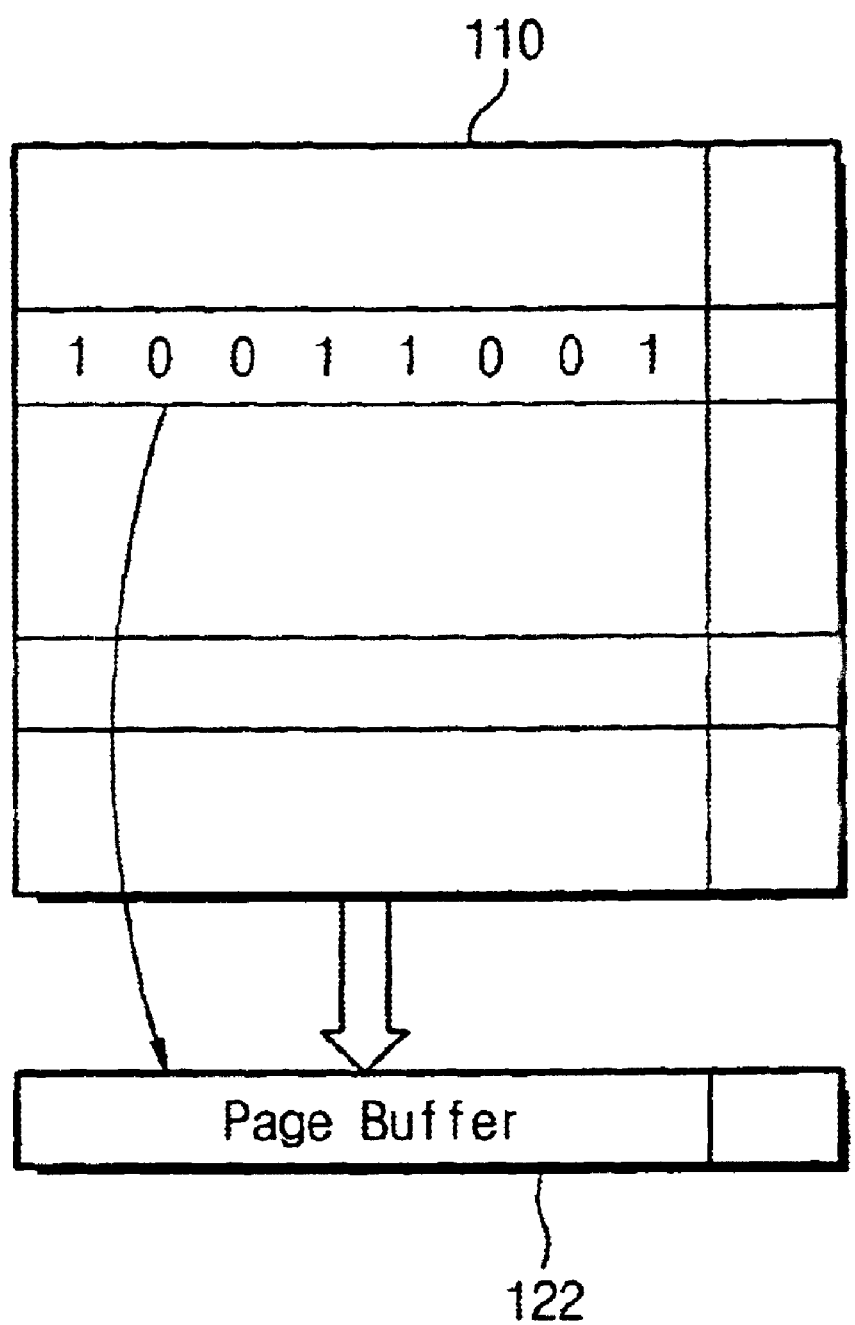
FIG. 13 is a depiction of data having been transferred from memory cells into a page buffer by following signal commands of a first portion of FIG. 12.
Figure 14:
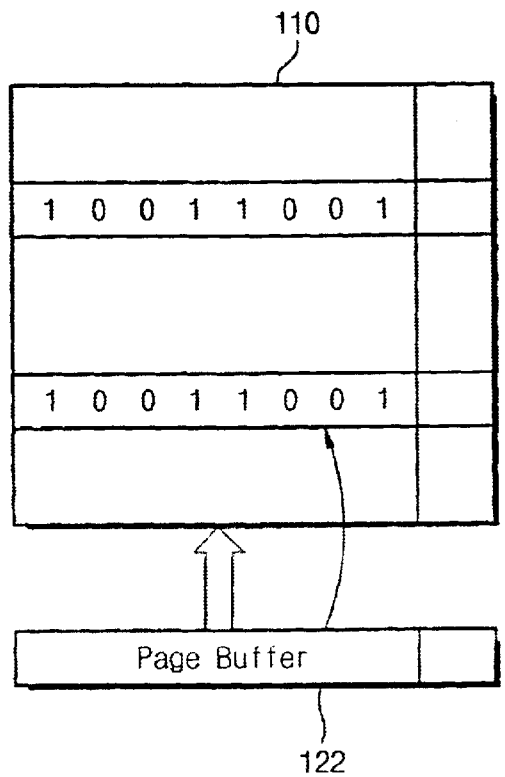
FIG. 14 is a depiction of data having been transferred from a page buffer into memory cells by following signal commands of a second portion of FIG. 12.

Referring now to FIG. 12, FIG. 13, FIG. 14, a copyback operation of the device of FIG. 3 is described in more detail. Data is assumed to be read out from original memory cells of array 110 into page buffer 122, and copied back there, into different cells.

FIG. 12 shows command signals that may be applied to the circuit of FIG. 5. The horizontal axis is divided in 11 time segments, respectively labeled 1, 2, . . . , 11.

The data is first read out from the cells to the page buffer. It will be recognized that the signal commands in the first four time segments 1, 2, 3, 4 are substantially the same as in those of FIG. 10, except that data is read into auxiliary register 170, instead of main register 150.

Figure 1:
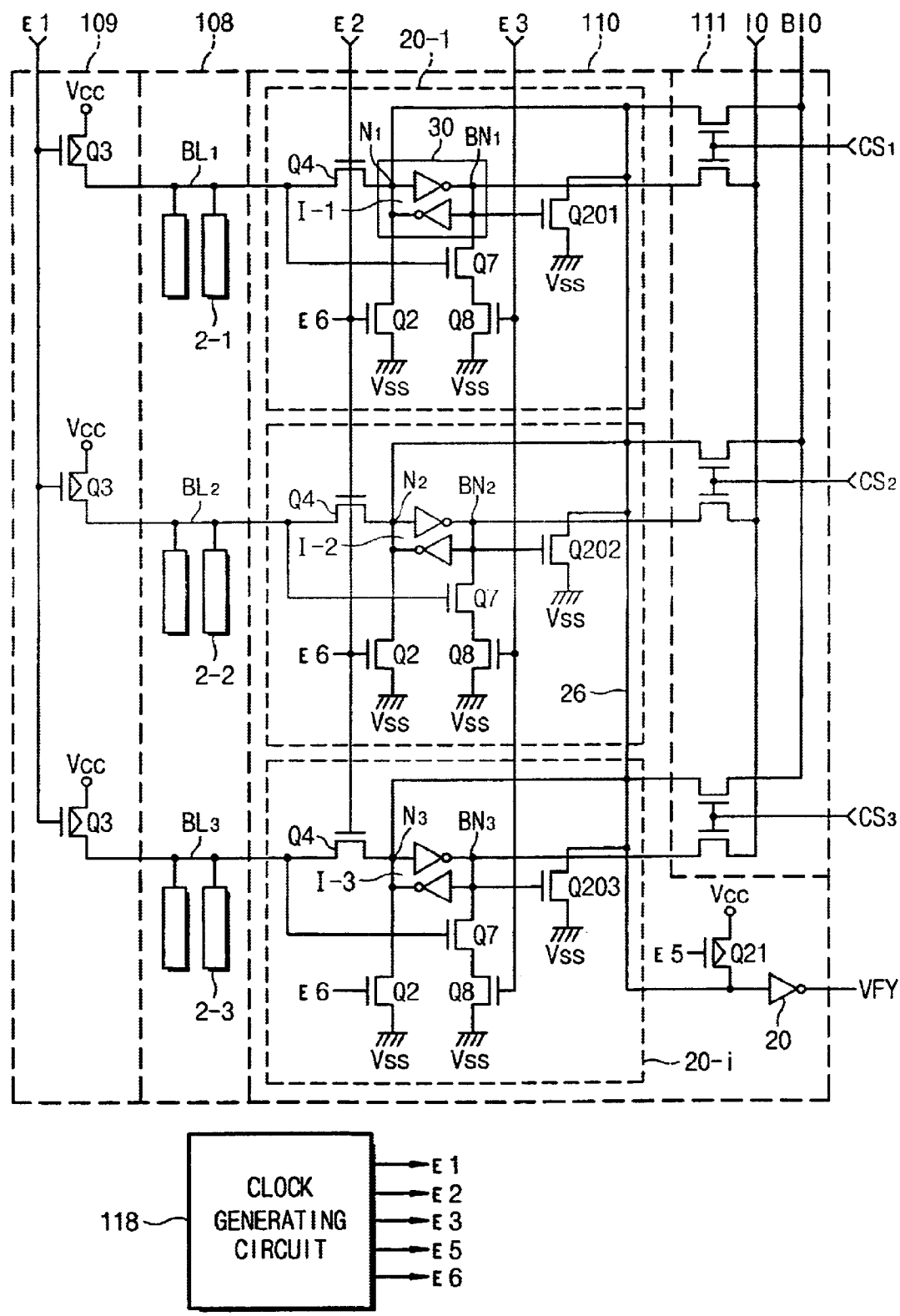
FIG. 1 is a diagram of a memory device having a page buffer in the prior art.
Figure 2:
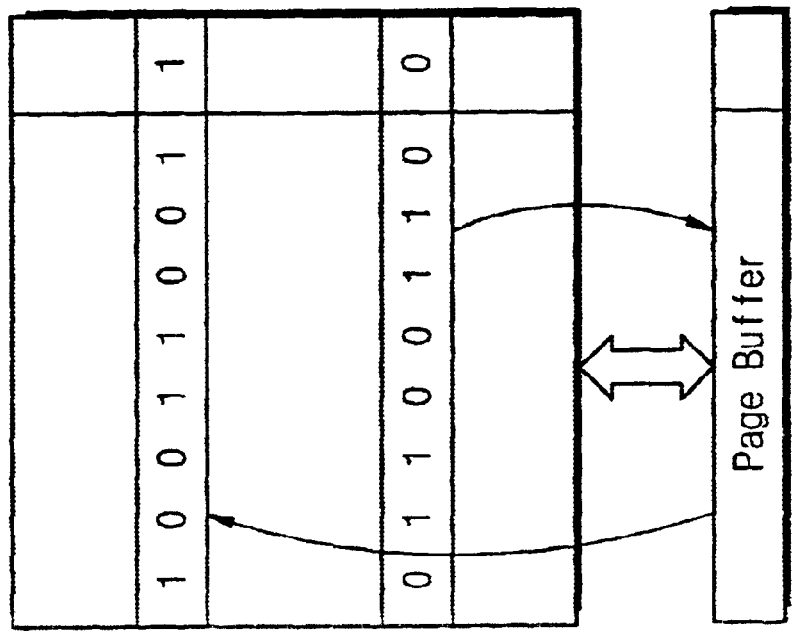
FIG. 2 is an illustration of a copyback operation in the prior art, and of the flag bit it render necessary because it inverts the data.
Figure 2:
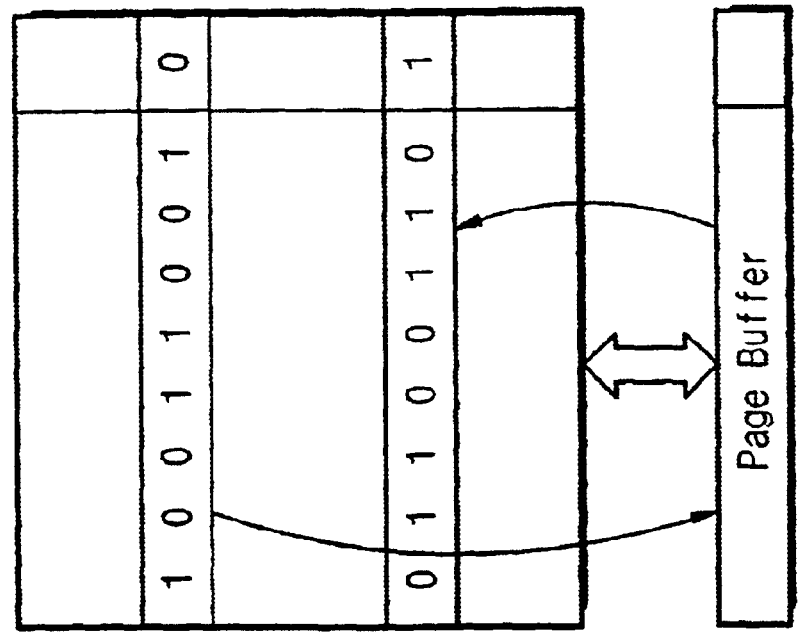

Referring to FIG. 13, the data read out into the page buffer is shown. A blank space is also shown, where the prior art of FIG. 2 required an additional indicator bit to indicate the polarity (inverted or not) of the stored data.

Returning to FIG. 12, the data is then transferred from auxiliary register 170 into main register 150 of the page buffer. This takes place during time segments 5, 6.

Then the data is programmed from main register 150 into other cells of the memory, during time segments 7, 8, 9, 10, 11. It will be recognized that the signal commands during time segments 5–11 are substantially the same as in those of FIG. 8.

Referring to FIG. 14, the reprogrammed data is shown. It will be appreciated that the data is stored in the different cells according to the invention without being inverted from how they were stored in the original cells. Accordingly, there is no need to include the indicator bit of FIG. 2, which further saves space.

Erase methods according to the invention are now discussed. Erasing generally dumps data. In a flash memory, the threshold voltage goes to a value between −1V and −3V by applying a high voltage to the memory cells. Data in registers is dumped.

Figure 15:
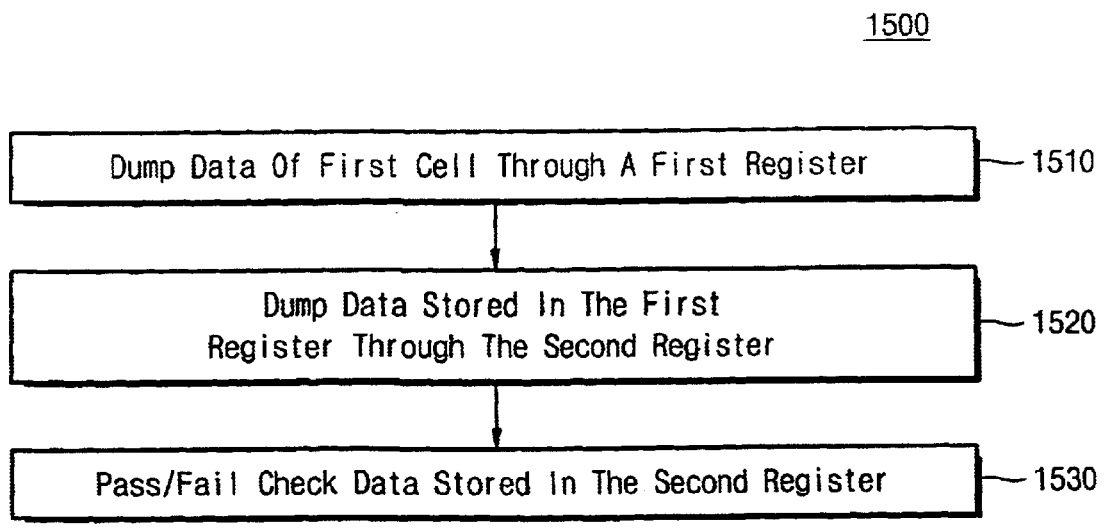
FIG. 15 is a flowchart illustrating an erase method according to an embodiment of the present invention.

Referring now to FIG. 15, a flowchart 1500 is used to illustrate a verify read operation after erasing according to another embodiment of the invention. The method of flowchart 1500 may also be practiced by device 100 of FIG. 3.

According to a box 1510, data of first memory cell is dumped through a first register of a page buffer.

According to another box 1520, data stored in the first register of the page buffer circuit is dumped through a second register.

According to an optional box 1530, data stored in the second register is checked pass or fail of the memory cell state by transistor 186.

Figure 16:
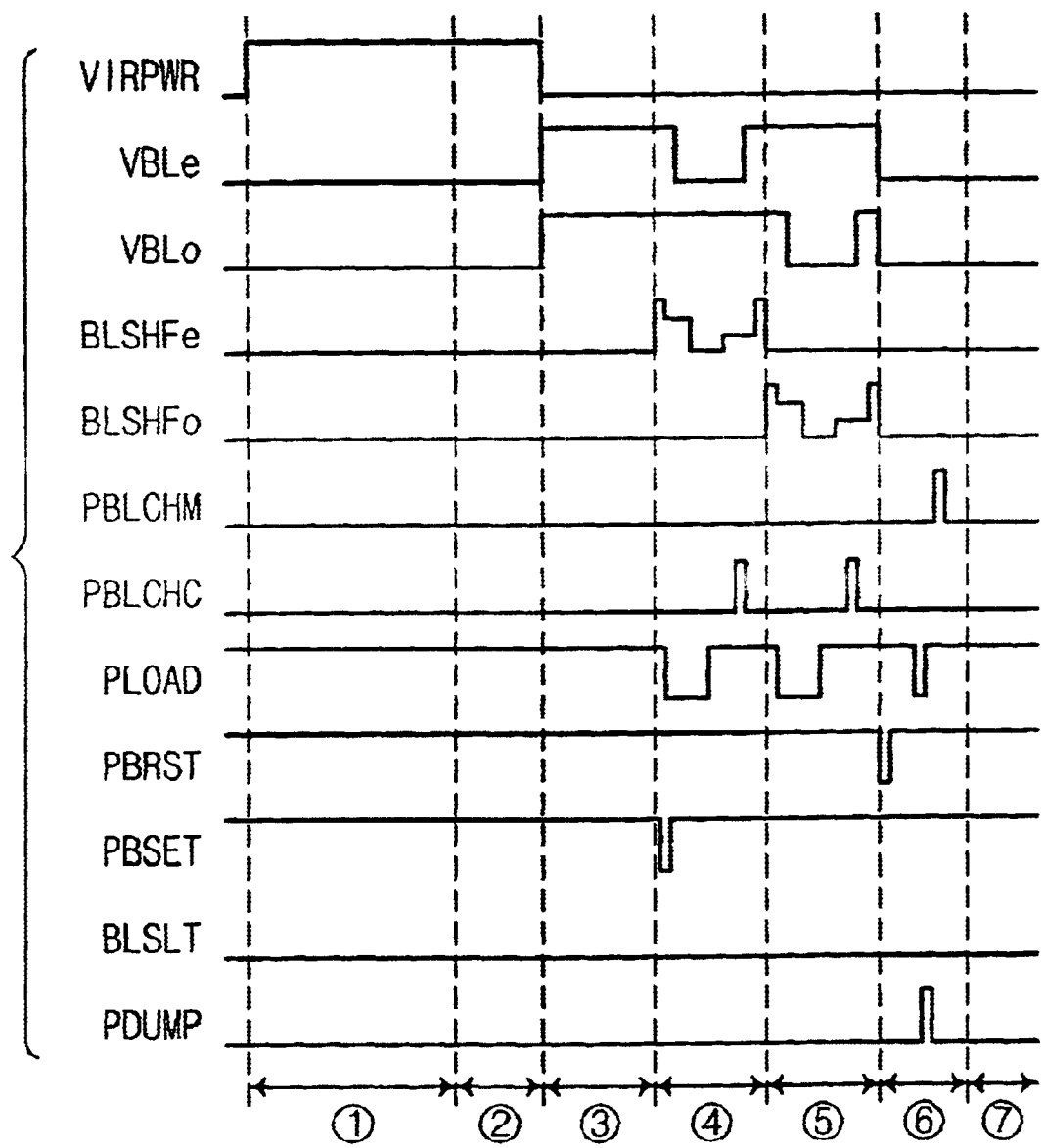
FIG. 16 is a timing diagram of signal commands for effectuating an erase method in the device of FIG. 3.
Figure 17:
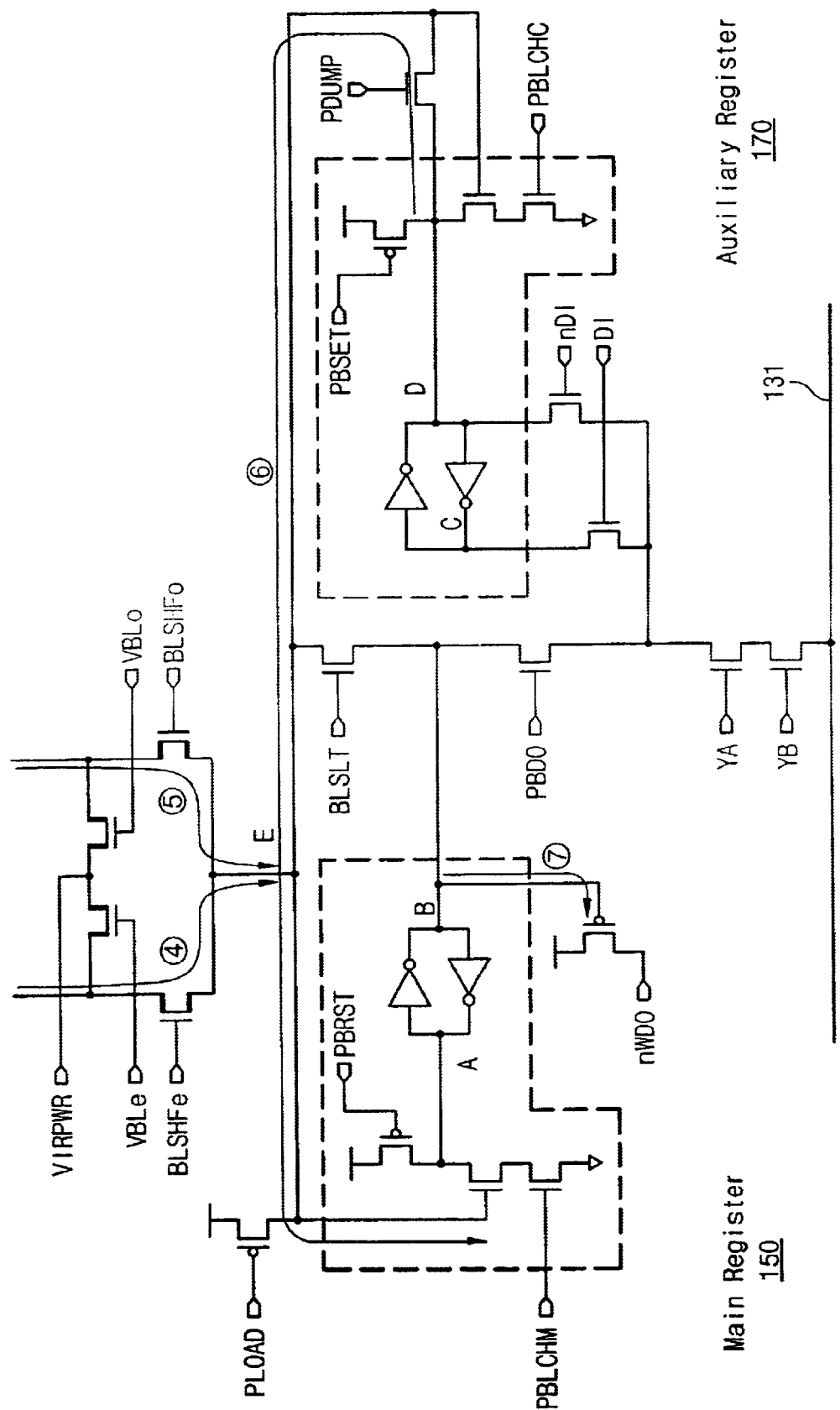
FIG. 17 is a depiction of flow of data in the circuit of FIG. 5, while the signal commands of FIG. 16 are being applied.

Referring now to FIG. 16 and FIG. 17, an erase method is described for the device of FIG. 3. FIG. 16 shows command signals that may be applied to the circuit of FIG. 5. The horizontal axis is divided in 6 time segments, respectively labeled 1, 2, . . . , 7.

FIG. 17 shows how data is erased in the circuit of FIG. 5, resulting from applying the command signals of FIG. 16. FIG. 17 should be referred to along with FIG. 16, using the same cross referenced time segments as FIG. 16.

In time segments 1 and 2, an erase execution command is received. In time segment 3, bit lines BLe, BLo are grounded for discharge. In time segment 4, a Verify Read operation takes place for a first cell. In time segment 5, a Verify Read operation takes place for a second cell.

In time segment 6, data is dumped through the first register. The data includes data of a memory cell, and also data from main register 150 and supplemental register 170 of the page buffer. In time segment 7, a wired OR operation takes place, and data is dumped from node B of main register 150.

The invention offers the advantage that, even if the size of the page is increased, the program time (or the information-storing time) of the memory is increased slightly or not at all. In addition, a time for loading information on the page buffer circuit is increased in proportion to the increased magnitude of the page.

Referring to FIG. 18, FIG. 19, FIG. 20, FIG. 21, examples are discussed of handling large volumes of data in memories. Efficiencies of the invention are thus illustrated.

Figure 18:
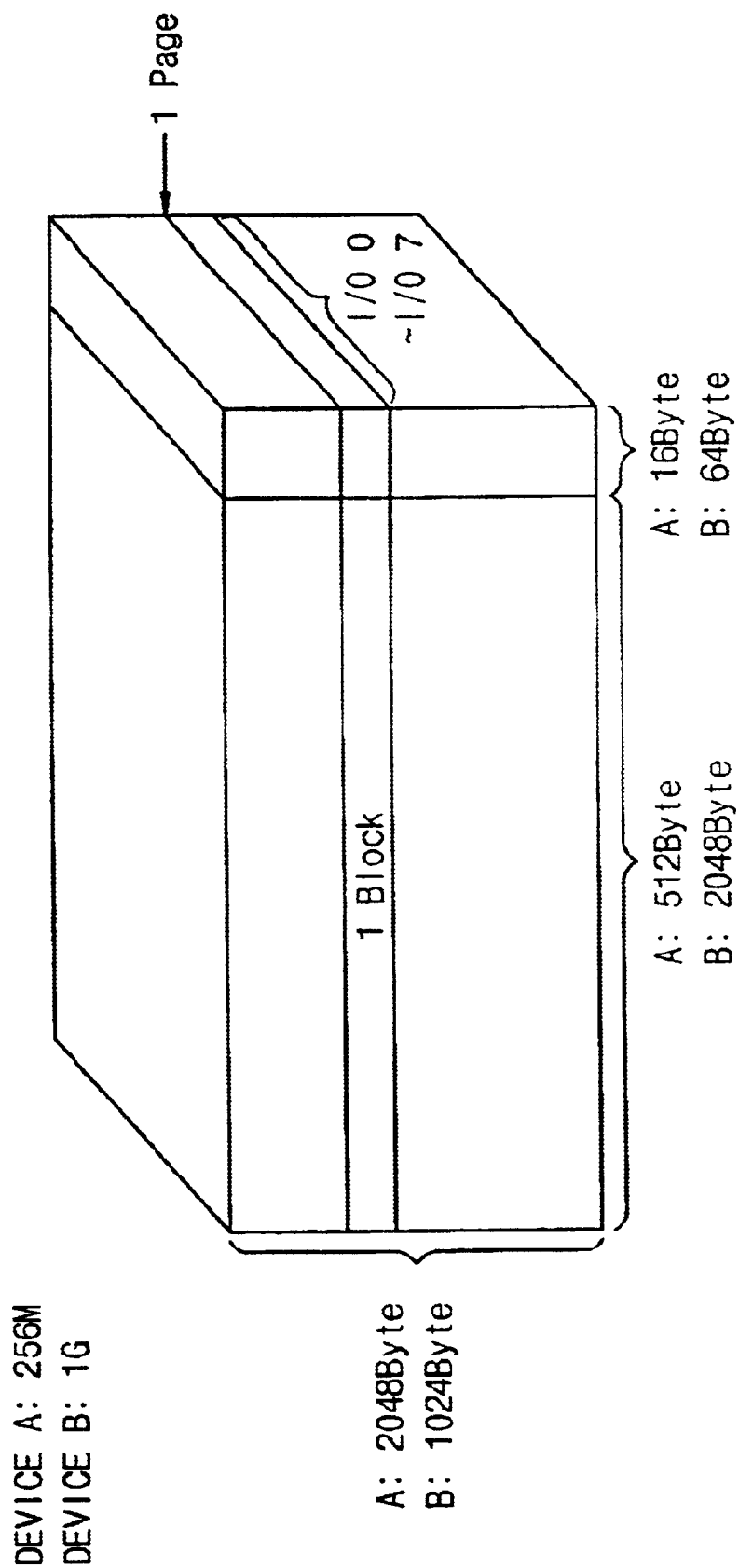
FIG. 18 is a depiction of how large volumes of memory are counted for two alternate memory device designs.

FIG. 18 is a depiction of how large volumes of memory are counted for the capacity of a memory device, for two cases, namely A and B.

A three dimensional box depicts the total memory capacity of a device. It can be thought of as a stack of blocks, and each block is a stack of pages. Each page (and also each block) is 1B wide. 1 byte equals eight bits, namely I/O0–I/O7.

In case A, one page is (512+16) 528 B long. Assuming blocks of 32 pages, a capacity of 2048 blocks will yield a device of 264 Mbit.

In case B, enabled by the present invention, one page is (2048+64) 2112 B long. Assuming blocks of 64 pages, a capacity of 1024 blocks will yield a device of 1 Gbit.

FIG. 19 displays various design choices for memory devices, including devices A and B of FIG. 18.

Figure 20:
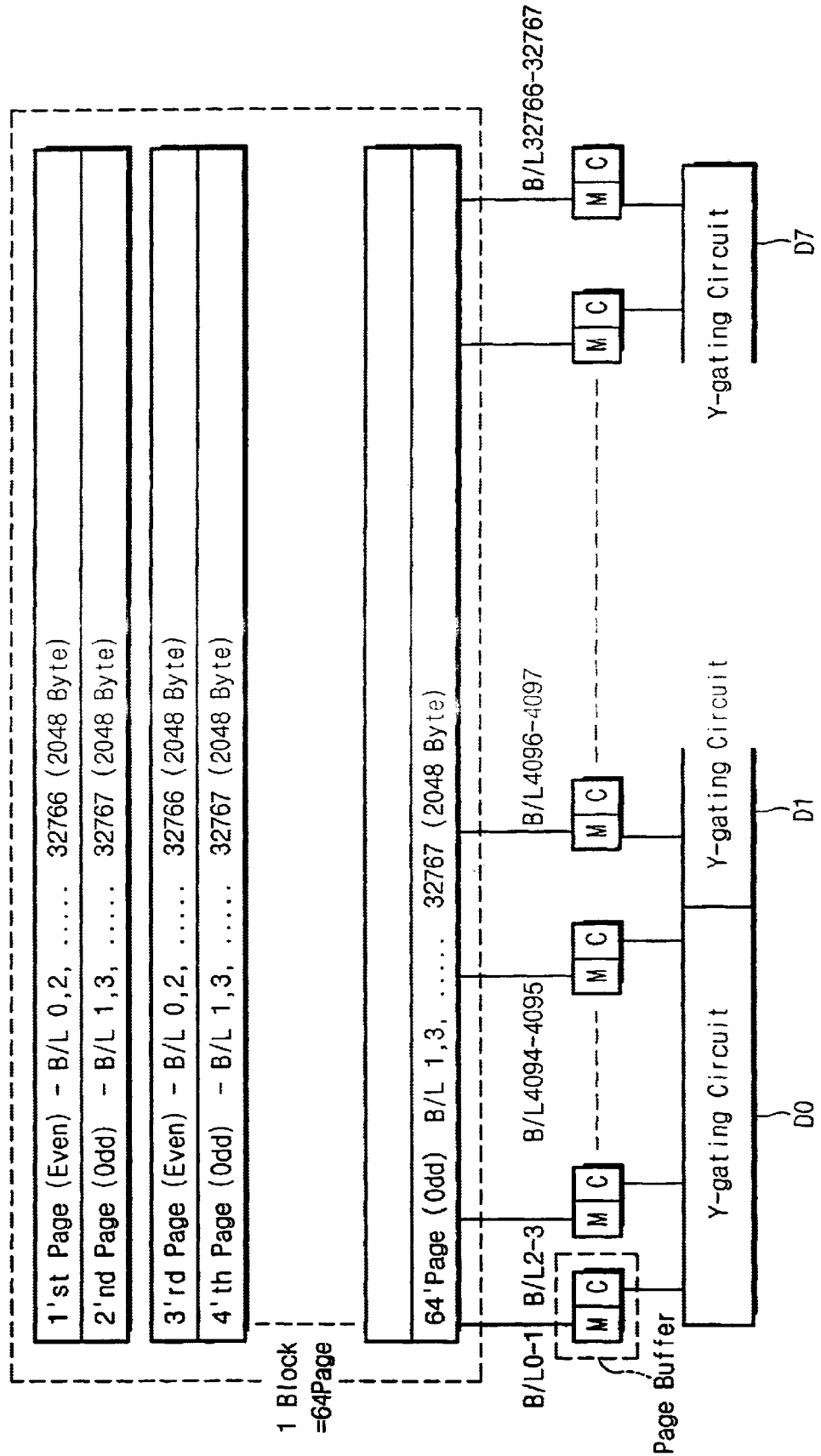
FIG. 20 is a block diagram illustrating the arrangement of 1 block.

FIG. 20 illustrates how a block can be reconfigured to 64 pages (such as for device B of FIG. 18) from 32 pages (such as for device A of FIG. 18) by designating successive pages of data as "even" and "odd".

The invention attains faster loading times than the prior art. This is illustrated by examples. Assuming:

T1=1 Byte loading time=0.1 $\mu$s
F2=1 page (for two cases of 528 bytes and 2112 bytes)
T3=program time=200 $\mu$s
F4=1 block (here 32 pages)

Then the time required by the device of the prior art for the sequence of data loading, program, data loading, program, etc. requires $$\text{Total time(prior art)} = [(T1 \times F2) + T3] \times F4 \qquad \text{Equation (1)}$$

This yields 8,089.6 $\mu$s for a device of 528 bytes and 13158.4 $\mu$s for a device of 2112 bytes. Accordingly, it is not possible to store information of large volume into the page buffer in a short time (the information-storing characteristic deteriorates).

Figure 21:
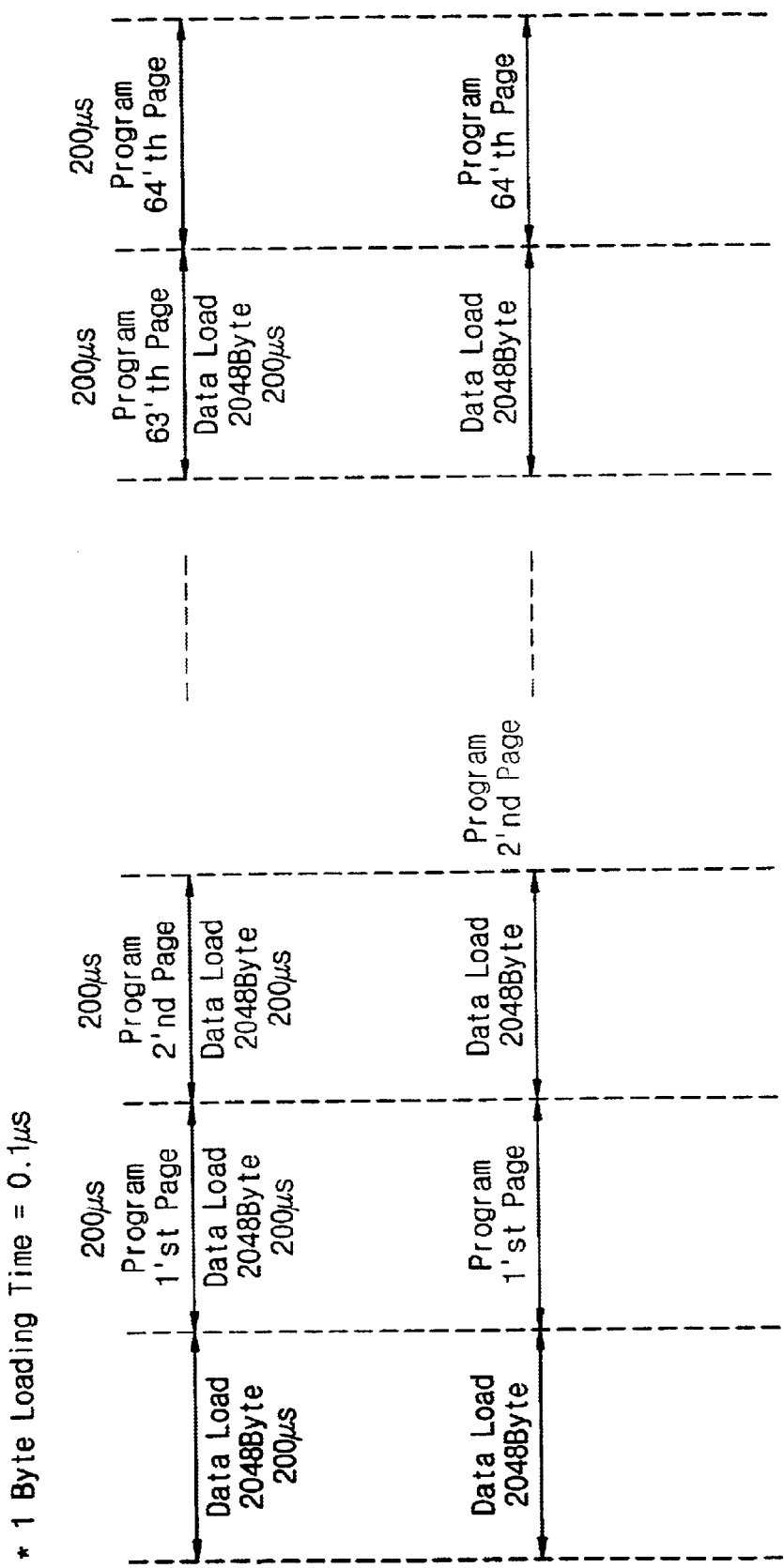
FIG. 21 is a diagram illustrating a time sequence of how data would be loaded according to the present invention to achieve higher capacity.

Referring to FIG. 21, data would be loaded and programmed according to the present invention more efficiently. The total time required would be $$\text{Total time(present invention)} = (T1 \times F2) + (T3 \times F4) \qquad \text{Equation (2)}$$

This, for a device of 2112 bytes, yields 6611.2 $\mu$s, which is about half of the coparable time of Equation 1. This means that a page buffer circuit of a large volume (e.g., over 2048 bytes) may now be used.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

The invention claimed is:

1. A nonvolatile memory cell device comprising:
   an array of memory cells to store data;
   a Y-gating circuit to gate data stored in a group of the memory cells; and
   a page buffer coupled between the memory cell array and the Y-gating circuit through a sense node, the page buffer including a first register and an associated second register corresponding to each memory cell of the group, in which the sense node is commonly coupled to the first register and second register,
   in which the first register is adapted to write data to a memory cell while the associated second register is adapted to concurrently store external data through the Y-gating circuit.

2. The device of claim 1, further comprising:
   an isolation switch to selectively isolate the first register from the second register.

3. The device of claim 1, in which each one of the first and the second registers includes
   a latch to store the data, and
   a precharge circuit to precharge the latch.

4. The device of claim 3, further comprising:
   a transistor to couple the latch to the Y-gating circuit.

5. The device of claim 1, further comprising:
   a plurality of bitlines to transfer data between the memory cell array and the page buffer,
   in which two of the bitlines terminate in the sense node of the page buffer.

6. The device of claim 5, in which
   the second register is adapted to transfer data to the first register through the sense node.

7. The device of claim 4, further comprising:
   a second transistor to selectively couple the sense node to the latch.

8. A program method for a nonvolatile memory device comprising:
   passing first external data through a Y-gating circuit;
   then storing the first data at a first register of a page buffer;
   then storing the first data at a second register of the page buffer through a sense node;
   and then storing the first data at a first cell of a memory cell array through the sense node.

9. The method of claim 8, in which
   the first external data is a whole page of data.

10. The method of claim 8, further comprising:
    activating an isolation switch to connect the first register with the second register prior to storing the first data in the second register.

11. The method of claim 8, in which
the Y-gating circuit permits to pass the first external data by byte unit.

12. The method of claim 11, in which
the byte unit is eight bits.

13. The method of claim 8, in which
the first data is stored from the first register to the second register of the page buffer by page unit.

14. The method of claim 8, in which
the first data is stored from the second register to the first cell of the memory cell array by page unit.

15. The method of claim 8, further comprising:
receiving and storing second external data in the first register concurrently with storing the first data at the first cell.

16. The method of claim 15, further comprising:
activating an isolation switch to isolate the first register from the second register.

17. The method of claim 15, further comprising:
storing the second data in a second cell of the array,
in which the first cell is coupled with the first register through a first bitline, and the second cell is coupled with the first register through a second bitline.

18. A program method for a nonvolatile memory device comprising:
storing data of a first cell in a memory cell array in a first register of a page buffer;
then storing the data in a second register of the page buffer; and
then storing the data in a second cell of the memory cell array.

19. The method of claim 18, further comprising:
activating an isolation switch to connect the first register with the second register.

20. The method of claim 18, in which
the data is stored in the second memory cell without being inverted from how it was stored in the first memory cell.

21. A pass/fail checking method for a nonvolatile memory device comprising:
dumping data of a first memory cell to a first register of a page buffer circuit through a sense node;
dumping data stored in the first register of the page buffer circuit to a second register through the sense node; and
checking the data in the second register.

22. The method of claim 21, further comprising:
activating an isolation switch to connect the first register with the second register.

* * * * *

UNITED STATES PATENT AND TRADEMARK OFFICE
CERTIFICATE OF CORRECTION

PATENT NO. : 6,671,204 B2
DATED : December 30, 2003
INVENTOR(S) : Im

It is certified that error appears in the above-identified patent and that said Letters Patent is hereby corrected as shown below:

Title page,
Item [60], Related U.S. Application Data, "filed on Jul. 27, 2001." should read -- filed on Jul. 23, 2001. --.

Column 10,
Line 53, "for a nonvolatile" should read -- for nonvolatile --.

Column 11,
Line 8, "from the first register to the second" should read -- from a first register to second --.
Line 9, "of the page buffer" should read -- of a page buffer --.
Line 11, "to the first" should read -- to a first --.
Line 12, "of the memory" should read -- of a memory --.
Line 25, "for a nonvolatile" should read -- for nonvolatile --.

Column 12,
Line 1, "array in a first" should read -- array at a first --.
Line 3, "data in a second register" should read -- data at a second register --.
Line 5, "data in a second cell" should read -- data at a second cell --.
Line 15, "for a nonvolatile" should read -- for nonvolatile --.

Signed and Sealed this

Twenty-ninth Day of June, 2004

JON W. DUDAS
*Acting Director of the United States Patent and Trademark Office*